(12) United States Patent
Hoffmann et al.

(10) Patent No.: US 8,961,690 B2
(45) Date of Patent: Feb. 24, 2015

(54) TOOLING CARRIER FOR INLINE COATING MACHINE, METHOD OF OPERATING THEREOF AND PROCESS OF COATING A SUBSTRATE

(75) Inventors: Uwe Hoffmann, Alzenau (DE); Jose Manuel Dieguez-Campo, Hanau (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 650 days.

(21) Appl. No.: 13/104,753

(22) Filed: May 10, 2011

(65) Prior Publication Data

US 2012/0276282 A1 Nov. 1, 2012

(30) Foreign Application Priority Data

Apr. 29, 2011 (EP) .................................... 11164348

(51) Int. Cl.
*B05D 5/00* (2006.01)
*B05C 13/00* (2006.01)
*C23C 14/54* (2006.01)
*C23C 14/12* (2006.01)

(52) U.S. Cl.
CPC ............... *C23C 14/542* (2013.01); *C23C 14/12* (2013.01)
USPC ........... 118/720; 118/665; 118/712; 118/719; 118/730

(58) Field of Classification Search
CPC ....................... C23C 16/4412; C23C 16/45561
See application file for complete search history.

(56) References Cited

U.S. PATENT DOCUMENTS

| | | | |
|---|---|---|---|
| 3,656,454 A * | 4/1972 | Schrader ..................... | 118/724 |
| 7,435,300 B2 | 10/2008 | Ling et al. | |
| 2001/0007244 A1* | 7/2001 | Matsuse ..................... | 118/719 |
| 2005/0244570 A1 | 11/2005 | Tanase et al. | |
| 2008/0098957 A1 | 5/2008 | Ryu et al. | |

FOREIGN PATENT DOCUMENTS

| | | |
|---|---|---|
| EP | 2230326 A1 | 9/2010 |
| WO | WO-2005093875 A1 | 10/2005 |
| WO | WO-2010027178 A2 | 3/2010 |

OTHER PUBLICATIONS

Extended European Search Report dated Aug. 9, 2011 for EP Application No. 11164348.2.

* cited by examiner

*Primary Examiner* — Parviz Hassanzadeh
*Assistant Examiner* — Nathan K Ford
(74) *Attorney, Agent, or Firm* — Patterson & Sheridan LLP

(57) ABSTRACT

A process of coating at least one substrate with a plurality of deposition sources, a method of tooling, a carrier unit and a deposition system are described. The systems and methods provide for or allow for exposing a first substrate portion 112*a* of said at least one substrate 112 to a first deposition source 118*a* through an aperture 122 of a carrier unit 110, 510, depositing a first layer 126*a* over the first substrate portion, said first layer including material from said first deposition source, varying a relative position between said at least one substrate and said aperture for exposing a second substrate portion of said at least one substrate, or another substrate, to a second deposition source, and depositing a second layer 126*b* over the second substrate portion 112*b*, said second layer including material from said second deposition source.

8 Claims, 6 Drawing Sheets

TOOLING CARRIER FOR INLINE COATING MACHINE, METHOD OF OPERATING THEREOF AND PROCESS OF COATING A SUBSTRATE

TECHNICAL FIELD OF THE INVENTION

Embodiments of the present invention relate to an evaporation system for use in a vacuum installation, a coating installation including the evaporation system, and a method of using the same. Embodiments of the present invention particularly relate to a process of coating at least one substrate with a plurality of deposition sources, typically for organic materials, a method of tooling a film-thickness monitoring signal, a carrier unit, and a deposition system configured to operate a carrier unit.

BACKGROUND OF THE INVENTION

Typically, for deposition of thin films on substrates the layer thickness of the deposited layer is of relevance. For many deposition processes deposition rate monitors are available. Signals of the deposition rate monitors and actually manufactured deposition rates can be correlated by a process called tooling, wherein a tooling factor is determined by the ratio of the deposited layer thickness and the rate measurement. This calibration might be particularly time consuming for deposition processes where a plurality of deposition sources and corresponding deposition rate measurements, each of which requires calibration, are provided. Applications with a particularly large number of deposition sources can be OLED manufacturing depositions.

Organic evaporators are an essential tool for the production of organic light-emitting diodes (OLED). OLEDs are a special type of light-emitting diodes in which the emissive layer comprises a thin-film of certain organic compounds. Such systems can be used in television screens, computer displays, portable system screens, and so on. OLEDs can also be used for general space illumination. The range of colors, brightness, and viewing angle possible with OLED displays are greater than those of traditional LCD displays because OLED pixels directly emit light and do not require a back light. Therefore, the energy consumption of OLED displays is considerably less than that of traditional LCD displays. Further, the fact that OLEDs can be manufactured onto flexible substrates opens the door to new applications such as roll-up displays or even displays embedded in clothing.

The functionality of an OLED depends on the coating thickness of the organic material. This thickness has to be within a predetermined range. In the production of OLEDs, it is therefore important that the coating rate, at which the coating with organic material is accomplished, lies within a predetermined tolerance range. In other words, the coating rate of an organic evaporator has to be controlled thoroughly in the production process.

Thereby, the deposition rate for OLED applications, but also for other deposition processes, needs to be controlled by a detector and the detector signal needs to be correlated with the thickness of the deposited layer. Accordingly, OLED deposition, but also all other deposition processes requiring a tooling between real deposition rate on a substrate and a signal of a rate measurement unit like oscillating quartz.

Typically, tooling is conducted by coating on one substrate and measuring the thickness after the coating in the coating machine or outside of the machine. This thickness can be transferred in a deposition rate and this is correlated to the signal of the measuring unit of the source. Typically, for each deposition source one substrate is used and coated with a standard carrier as used during production. Such a procedure—for a machine with many deposition sources (e.g. 10 or more sources for OLED applications)—requires a long time period because for each source a new substrate has to be handled one after the other.

SUMMARY OF THE INVENTION

According to one embodiment, a process of coating at least one substrate with a plurality of deposition sources is provided. The process includes exposing a first substrate portion of said at least one substrate to a first deposition source through an aperture of a carrier unit, depositing a first layer over the first substrate portion, said first layer including material from said first deposition source, varying a relative position between said at least one substrate and said aperture for exposing a second substrate portion of said at least one substrate, or another substrate, to a second deposition source, and depositing a second layer over the second substrate portion, said second layer including material from said second deposition source.

According to a further embodiment, a method of tooling a film-thickness monitoring signal is provided. The method includes exposing a first substrate portion of said at least one substrate to a first deposition source through an aperture of a carrier unit, depositing a first layer over the first substrate portion, said first layer including material from said first deposition source, varying a relative position between said at least one substrate and said aperture for exposing a second substrate portion of said at least one substrate, or another substrate, to a second deposition source, and depositing a second layer over the second substrate portion, said second layer including material from said second deposition source. Therein, said film-thickness monitoring signal corresponds to a thickness of a layer deposited over said substrate and is generated while said at least one substrate is exposed, at least partially, to at least one of the plurality of deposition sources.

According to a yet further embodiment, a carrier unit for carrying at least one substrate within a deposition system including a plurality of deposition sources is provided. The carrier unit includes an aperture for partially exposing said at least one substrate to a deposition source of said deposition system, and an adjusting system configured to adjust a relative position between said at least one substrate and said aperture, so that different portions of said substrate can be exposed to different deposition sources of said deposition system.

According to another embodiment a deposition system is provided. The deposition system includes: at least one vacuum chamber, and a plurality of deposition sources for coating a substrate in said at least one vacuum chamber, wherein said deposition system is configured to operate a carrier unit, wherein the carrier unit for carrying at least one substrate within a deposition system including a plurality of deposition sources, includes an aperture for partially exposing said at least one substrate to a deposition source of said deposition system, and an adjusting system configured to adjust a relative position between said at least one substrate and said aperture, so that different portions of said substrate can be exposed to different deposition sources of said deposition system.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1A:
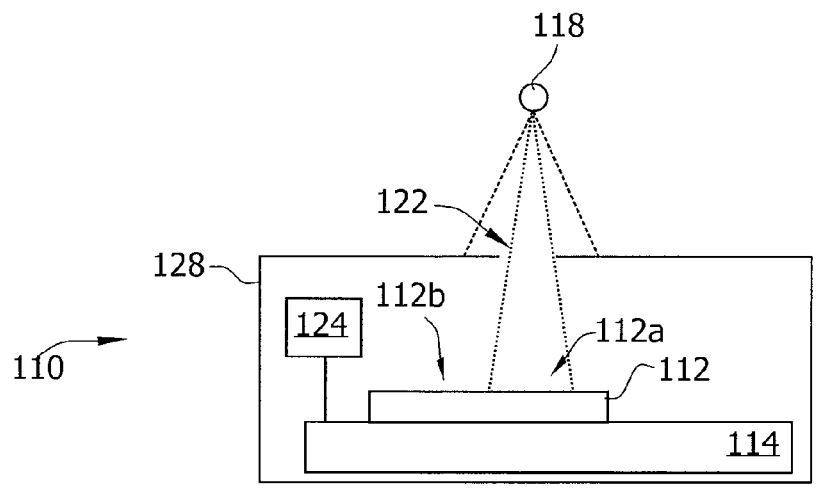
FIGS. 1A and 1B show schematic views of a carrier unit according to embodiments described herein, which are particularly useful for tooling.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Embodiments of the present invention relate to an improved tooling, e.g. calculation of a tooling factor, for applications with a plurality of deposition source, wherein a signal of a deposition rate sensor can be calibrated with thickness of deposited layers. If during operation of a deposition system a layer is deposited on a substrate, e.g. a test substrate for tooling, a coating step for one source, loading and unloading of a substrate and the exchange to another substrate, depending on machine layout and speed of pumping, handling etc. can take up to 15 to 20 minutes. Generally, it is possible to save time by coating several layers on top of each other, wherein it is beneficial to use a measuring method and analysis software, which enables extraction of the thickness information from a stack of several layers for each layer. However, this is complex and might not be possible for all types of layer stacks. Accordingly, embodiments described herein relate to a process of coating at least one substrate with a plurality of deposition sources and a variation or adjustment of a relative position between the substrate and an aperture.

Generally, the term "tooling" as used herein relates to thin-film thickness monitors, deposition rate controllers, deposition rate detectors, deposition rate sensors, or the like, which can be e.g. used in high and ultra-high vacuum systems. These terms: thin-film thickness monitors, deposition rate controllers, deposition rate detectors, deposition rate sensors are used synonymously herein. Such detectors, monitors, controllers and/or sensor can measure the thickness of a thin film, not only after it has been made, but while it is still being deposited, and by utilizing such a measurement device one can control either the final thickness of the film, the rate at which it is deposited, or both. Typically, the rate at which material is deposited on the sensor may not equal the rate at which the material is deposited on the sample. The ratio of the two rates can be defined as the "tooling factor". Alternatively, the tooling factor can be defined by ratio of the actually deposited layer thickness and a layer thickness measured by sensor. For careful work, the tooling factor should be checked by measuring the amount of material deposited on some samples and comparing it to what the thickness monitor measured. Accordingly, "tooling" refers to a calibration of the inline measurement device for online measurement of the layer thickness.

For example, such sensor can, e.g., use a quartz crystal. Alternatively or additionally optical measurements can be used. Some of these sensors can for example measure the amount of material deposited on the sensor. Examples of thickness correlated measurements are described in patent application EP 2230326 A1, filed on Mar. 16, 2009 entitled "Evaporator, coating installation, and method for use thereof" and EP patent application 10196882.4, filed on Dec. 23, 2010, entitled "Evaporation system with measurement unit", both of which are incorporated herein by reference to the extent that the applications are not inconsistent with this disclosure. Therein, an evaporation system for applying vapor to a substrate in a vacuum chamber at a coating rate is provided. The system including a distribution pipe having an inlet for receiving the vapor; an evaporation section having a first outlet for applying the vapor to a substrate, the evaporation section defining a first fluidal path for the vapor to go from the inlet to the first outlet; a measurement section having a second outlet for displacing the vapor from the measurement section, the measurement section defining a second fluidal path for the vapor to go from the inlet to the second outlet; and a light sensitive detector for measuring at least one characteristic property of the vapor in the measurement section. Further, an evaporator for applying vapor to a substrate at a coating rate can be provided. The evaporator includes an evaporator tube having a distribution pipe with at least one nozzle outlet, and wherein the evaporator tube includes a pressure measurement device, the pressure measurement device including an optical diaphragm gauge.

FIG. 1A illustrates a carrier unit 110 according to embodiments described herein. The carrier unit 110 includes a carrier frame 128. Typically, the carrier unit is configured for holding or supporting a substrate during deposition. The carrier unit according to embodiments described herein is further configured for tooling, i.e. calibration, of a deposition source and the corresponding measurement unit, such as the deposition rate monitor. Within the carrier frame 128 a substrate support area 114 is provided. FIG. 1A shows substrate 112 being supported on the substrate support. Typically, the substrate has a first portion 112a and the second portion 112b. According to some embodiments, which can be combined with other embodiments described herein, at least one substrate with a first substrate portion and a second substrate portion is provided. Thereby, the first substrate portion and the second substrate portion can be provided on one substrate or alternatively on different substrates of the at least one substrate.

FIG. 1A further shows an adjusting system 124 which is configured to move the substrate 112 relative to the aperture 122. The aperture 122 thereby can have an aperture opening being configured for exposing one portion of the substrate to evaporated material or the like. Further, the aperture blocks a portion of material to be deposited by the deposition source.

Figure 1B:
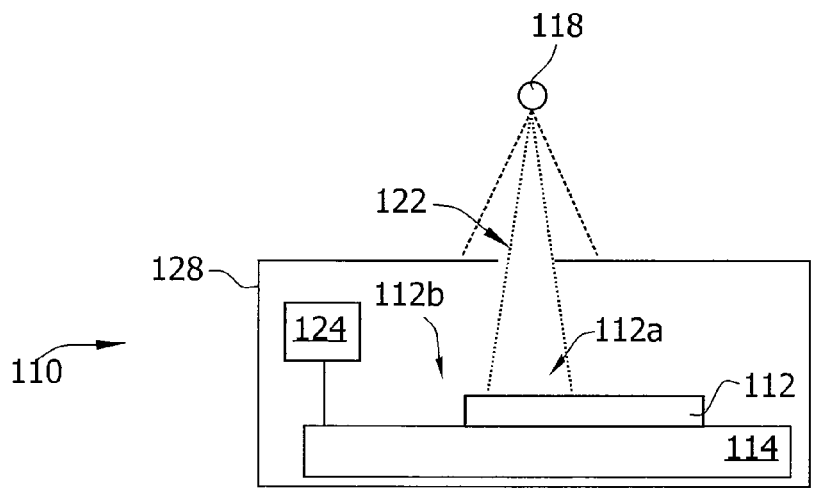

FIG. 1A further illustrates the deposition source 118 from which material, which is to be deposited on the substrate, is directed towards a deposition area, in which the carrier unit is provided. As can be seen in FIG. 1A, the aperture 122 exposes the first portion 112a of the substrate 112 for deposition with the material from the deposition source. The adjusting system 124, which is illustrated in FIG. 1A, can be an actuator for moving the substrate 112 relative to the aperture 122. As shown in FIG. 1B, the substrate 112 is moved by a translation to the right-hand side such that the second substrate portion 112b is positioned below the opening of the aperture 122. Accordingly, it is possible by utilizing the carrier unit 110 to deposit layers of material from the deposition source adjacent or next to each other.

According to some embodiments, which can be combined with other embodiments described herein, a layer, e.g. a coating layer, is formed by a coating process with the coating source or deposition source, respectively. Thereby, typically the layers can be deposited to be substantially coplanar to each other, to be in direct contact with the substrate, and/or not to be provided as a layer stack, i.e., one layer is not provided on another layer or at least only partially provided on another layer. Thereby, the layers deposited are each provided on the substrate without any other layer being deposited above or below the respective coated layer.

Figure 2A:
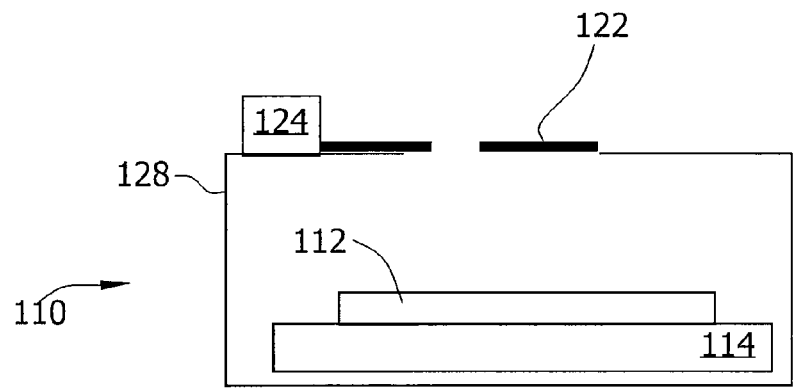
FIGS. 2A and 2B show schematic views of a further carrier unit according to embodiments described herein, which are particularly useful for tooling.
Figure 2B:
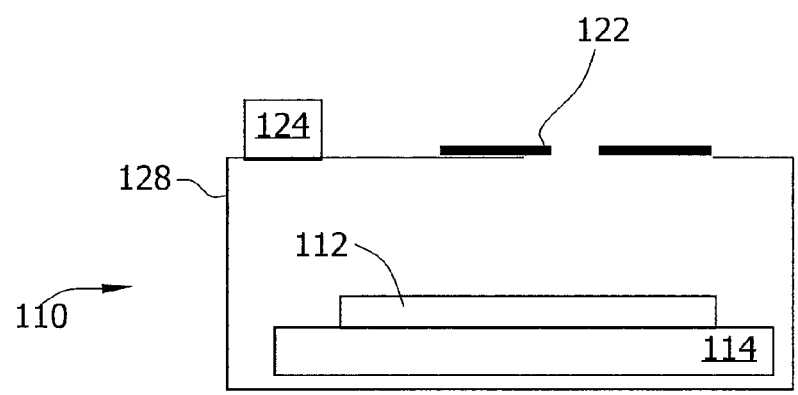

FIGS. 2A and 2B illustrate yet further embodiments of carrier units as described herein and being suitable for processes and deposition systems according to embodiments described herein. The carrier unit 110 shown in FIG. 2A includes the carrier frame 128, the substrate support portion 114, and further shows the substrate 112 provided on the substrate support. The adjusting system 124 for adjusting the relative position between the aperture 122 and a substrate portion of the substrate 112 is connected to the aperture 122. Thereby, as can be seen from a comparison of FIGS. 2A and 2B, the aperture 122 can be moved relative to the substrate 112 in order to expose different substrate portions to material to be deposited.

According to some embodiments, which can be combined with other embodiments described herein, the adjusting system can be an actuator, a motor, e.g. an electrically driven motor, or a drive and/or can be configured to adjust the aperture substrate relative position by linear translation, by rotation or a combination thereof. According to typical implementations, the adjusting system can either be configured for moving the substrate on a substrate support, can be connected to the aperture for movement of the aperture, or a combination thereof.

According to typical embodiments, a carrier unit as described herein includes an aperture for partially exposing one or more substrates to material from the deposition sources in the deposition system. An adjusting system adapted to adjust the relative position between said aperture and the location, on which the substrate is supported, is provided. Thereby, different portions of the one or more substrates can be exposed subsequently.

Accordingly, embodiments described herein can provide and/or use a special measuring carrier, which is provided with the movement unit for moving an aperture plate in front of one or more substrates, e.g. fixed substrates, for moving the one or more substrates relative to the fixed aperture plate, or for moving both elements relative to each other. Thereby, after deposition for calibration is conducted for one source of a deposition system, the movement enables deposition or coating of another substrate or another portion of the substrate with a second source while the previously coated layer is protected from additional deposition. This process can be repeated a plurality of times until all sources in the deposition system have deposited one layer on the one or more substrates. According to embodiments described herein, this is possible without loading or unloading of the carrier.

After all sources to be calibrated have coated one portion of the one or more substrates, the carrier can be provided to a measurement unit and the layer thicknesses of layers corresponding to the respective sources can be measured. In light of the fact that the layers, which have been deposited by the individual sources, are provided next to each other, e.g. coplanar to each other, the measurement of the layer thicknesses can be done as if one single layer would be deposited on one substrate after the other. Accordingly, a thickness measurement is possible similar to individually coated layers and calibration or tooling of the sources or the rate monitors, respectively, can be conducted for all sources in the deposition system. Thereby, the carrier unit needs to be loaded only once in the deposition system having a plurality of sources.

Figure 3:
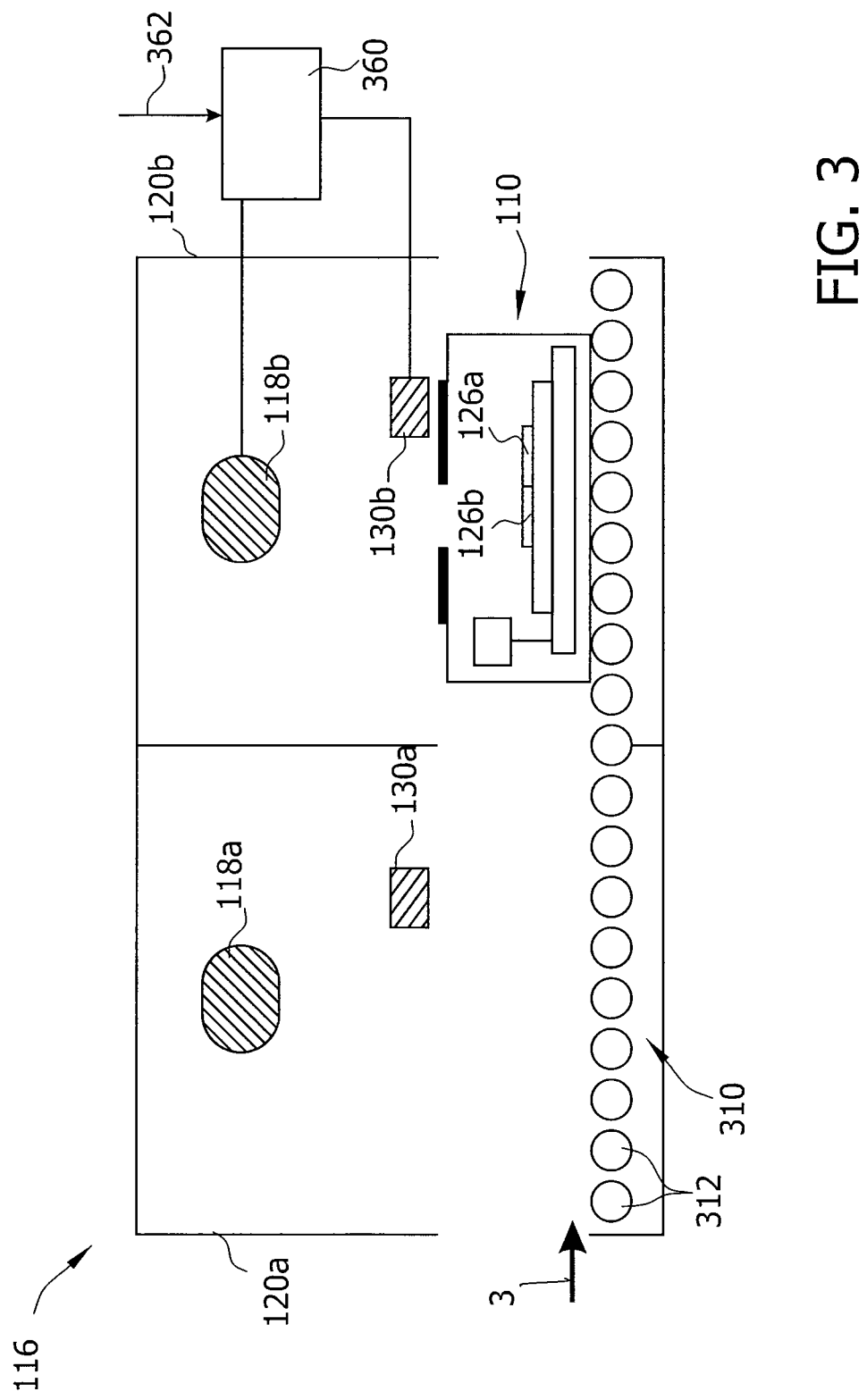
FIG. 3 illustrates a processing system adapted for a carrier unit and according to embodiments described herein.

FIG. 3 illustrates a deposition system 116 according to embodiments described herein. The deposition system 116 includes a first vacuum chamber 120a and the second vacuum chamber 120b. According to typical embodiments, the vacuum chambers can be evacuated individually or a common evacuation system can be provided for the chambers, i.e. the chambers 120a and 120b can be sub-chambers of one vacuum chamber. Typically, the deposition processes referred herein are conducted at a reduced pressure of 1 Pa or below. However, the principal of the tooling described herein can also be applied for deposition processes under other pressure conditions, such as normal pressure.

The deposition system 116 includes transport system 310, which can, for example, be provided with rollers 312. For easier illustration the deposition system shown in FIG. 3 is a horizontal deposition system, wherein the carrier 110 and the respective substrates are transported horizontally. However, if FIG. 3 would be interpreted as the top view, it is apparent that also vertical deposition systems can similarly implement the processes as described herein and can utilize the carrier units as described herein.

The deposition system shown in FIG. 3 includes the first deposition source 118a and the first deposition rate measurement system 130a. Considering a transport direction as indicated by arrow 3 for substrates or carrier units, respectively, the carrier unit 110 has passed the deposition source 118a when being positioned as shown in FIG. 3. Accordingly, the first layer 126a has already been deposited on the substrate within the carrier unit 110. The further vacuum chamber 120b includes a further deposition source 118b and a further deposition rate measurement system 130b. As shown in FIG. 3, the second layer 126b has been deposited on the substrate. Thereby, the first layer 126a and the second layer 126b are provided next to each other with respect to the surface of the substrate, e.g., they can be essentially coplanar as described above. Thus, after deposition of the first layer 126a and the second layer 126b, the layer thicknesses of the first layer and the second layer can be measured individually.

FIG. 3 illustrates the deposition system 116 with two deposition sources. Yet it is to be understood that this is for illustrative purposes only. According to further embodiments, which can be combined with other embodiments described herein, the deposition systems and processes can include, for example, five or more sources or even 10 or more sources. Thereby, in light of the fact that deposition systems and deposition processes for organic materials might include a particularly high number of deposition sources, the embodiments described herein can be particularly useful for applications including evaporation of organic materials.

According to yet further embodiments, which can be combined with other embodiments described herein, the controller 360, can be connected to the deposition source 118 and to the deposition rate monitor 130b. For example, the controller 360 can control the evaporation rate of the deposition source. Further, it can receive that deposition rate signal from the deposition rate monitor 130b.

Tooling or calibration of the deposition rate signal can be conducted by receiving a further signal 362 from a thickness measurement, for example, a direct thickness measurement, which can be conducted, for example, off-line from the deposition system 116. FIG. 3 illustrates the controller 360 to be connected to the deposition source 118b and the deposition rate monitor 130b. It is to be understood that according to further embodiments, the controller 360 can also be provided for more than one deposition source and more than one rate measuring sensor. Alternatively controllers can be provided for each deposition rate and deposition rate sensor, respectively.

Figure 4:
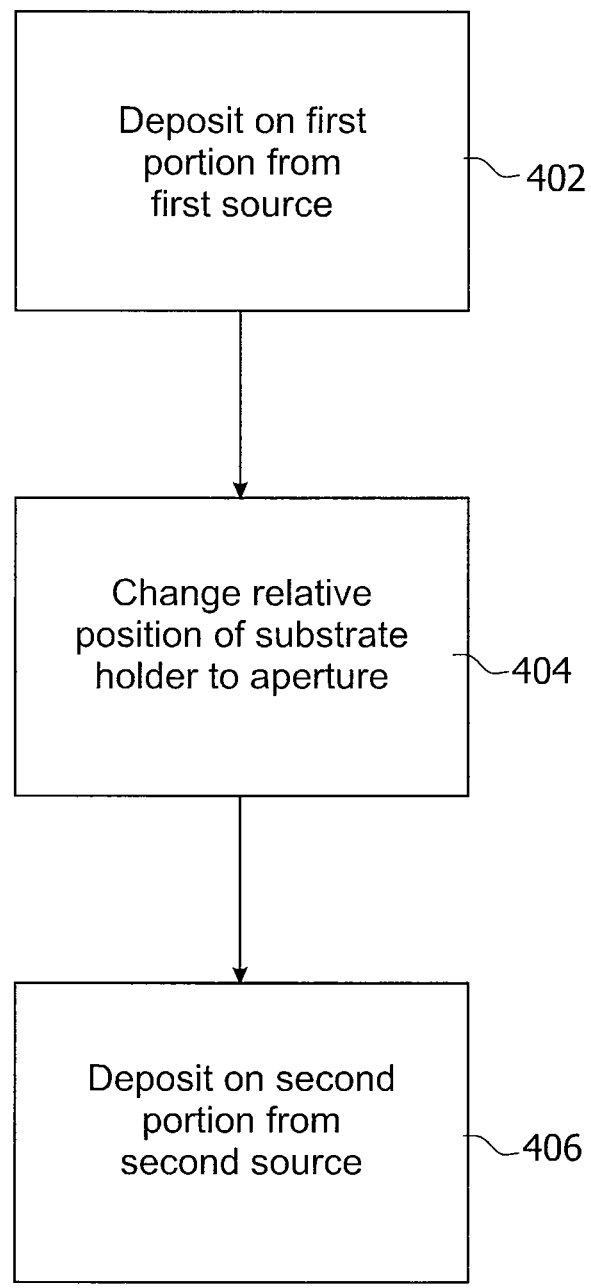
FIG. 4 shows a flow chart, which illustrates processes of coating a substrate according to embodiments described herein and methods of tooling according to embodiments described herein.

FIG. 4 illustrates a process of coating at least one substrate, particularly for tooling. Therein, the layer is deposited on the first portion of one or more substrates from a first deposition source in step 402. Thereafter, the relative position between an aperture for blocking a portion of the material to be deposited, i.e., for exposing a portion of the one or more substrates, and the substrate holder or substrate, respectively is changed in step 404. Thereafter, material can be deposited on the second portion of the one or more substrates from the second source in step 406. Accordingly, embodiments described herein relate to exposing the first substrate portion to the first deposition source through an aperture of the carrier unit, depositing a first layer on said first substrate portion, varying a relative position between said one or more substrate and said aperture for exposing the second substrate portion to the second deposition source and depositing the second layer over the second substrate portion. Typically, said first substrate portion and said second substrate portion can be portions of the single substrates or can be portions of a plurality of substrates.

According to yet further embodiments, the process of coating at least one substrate with a plurality of deposition sources can further be utilized for method of tooling the film-thickness monitoring signal. Therein, the film-thickness monitoring signal corresponds to the thickness of the layer deposited in the corresponding portion of the one or more substrates. Typically, the layer thicknesses can be measured individually and can be used for calibration of the corresponding film-thickness monitoring signal of the film-thickness monitors, sensors or detectors, which are provided for the respective deposition sources. For example, the first monitoring signal from the deposition of said first layer on said first substrate portion can be generated, the second film-thickness monitoring signal from said deposition of said second layer on said second substrate portion can be generated, thickness measurements of said first layer and the second layer can be performed and the first and second monitoring signals can be cooled or calibrated by the thickness measurements.

According to some embodiments, the thickness measurements, i.e., the direct thickness measurements, can be conducted with methods like interferometric measurements, XRF measurements, measurements of the optical density of the layer, i.e. transmission measurements, ellipsometry measurements, photoluminescence measurements, and combinations thereof. According to yet further embodiments, such measurements can be conducted after the substrate is removed from the measurement carrier unit or within the measurement carrier unit. In the latter case, the movement of the adjusting system for moving a relative position between the aperture and the substrate can be repeated or conducted in an opposite direction such that all coating positions can be subsequently exposed to the measurement system for directly measuring the layer thicknesses.

Figure 5:
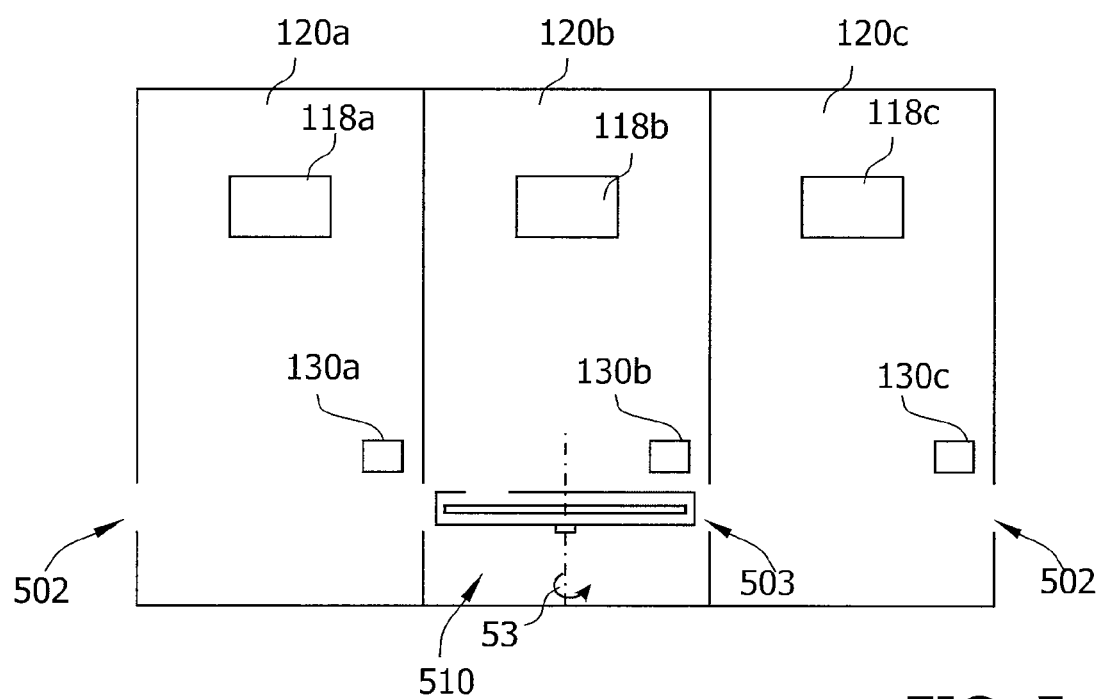
FIG. 5 shows a schematic view of a further processing system adapted for a carrier unit and according to embodiments described herein.

FIG. 5 illustrates yet further embodiments of deposition systems, wherein a measurement carrier unit 510 is provided. Accordingly, the deposition system 116 is configured for handling and/or operating a measurement carrier unit according to embodiments described herein. The deposition system 116 shown in FIG. 5 includes a plurality of vacuum chambers 120a, 120b and 120c. Deposition sources 118a, 118b, and 118c are provided in the respective chambers. However, it is to be understood that also more than one deposition source can be provided within one vacuum chamber. The first vacuum chamber 120a includes an opening 502 for insertion of the carrier unit 510 in the deposition system. The opening 502 can typically be sealed with the vacuum valve or can be connected to the load lock chamber for inserting and/or removing substrates or carriers, respectively. Further openings 503 are provided between the respective vacuum chambers. Depending on the processes to be conducted within the individual chambers, the openings 503 can either be closed by valve units during the deposition, or gas separation units in the form of slits having a sufficient resistance for gas traveling from one vacuum chamber in another vacuum chamber can be provided. A further opening 502 is provided at the opposing end of the deposition system 116 for feeding or removing carriers for substrates, respectively. The carrier unit 510, which is illustrated in FIG. 5, includes a rotation adjusting system as indicated by arrow 53. Corresponding embodiments are described with respect to FIGS. 6A and 6B.

Figure 6A:
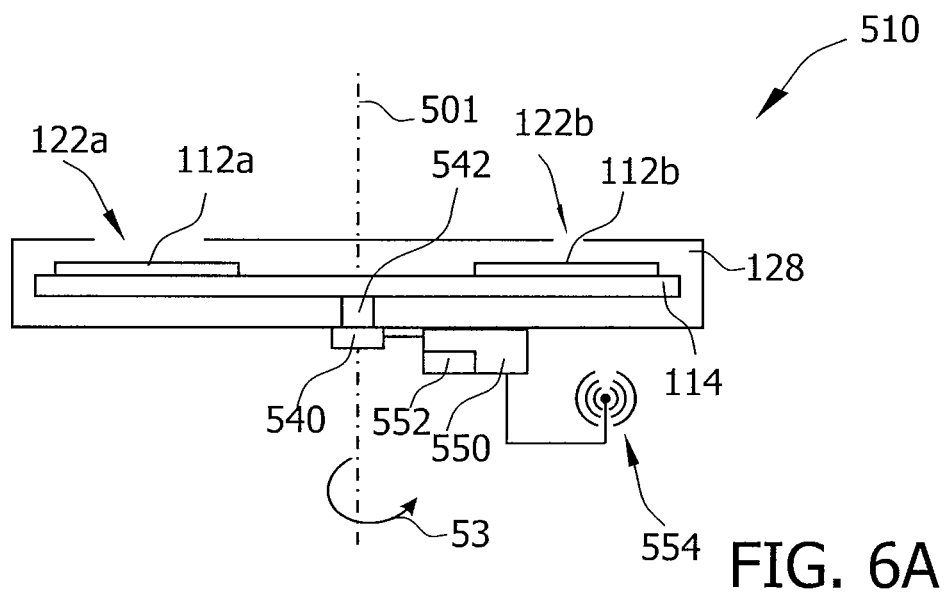
FIGS. 6A and 6B show schematic views of a yet further carrier unit according to embodiments described herein, which are particularly useful for tooling.

The carrier unit 510, which is shown in FIG. 6A includes substrate support portion 114 wherein a plurality of substrates 112a, 112b are provided. The substrate support portion 114 can be rotated around axis 501 indicated by arrow 53. The substrate support portion 114 is connected to an electrical motor 540 via shaft 542. The rotation of the portions of the one or more substrates below the one or more apertures 122a and 122b can be controlled by a controller 550. For example, the controller can include a battery 552 or another remote energy source for driving an actuator or motor electrically. Further, the controller can be connected to an antenna 554 or another means for receiving the radio signal. Thereby, the carrier unit 510 can be controlled while being provided within the deposition system.

Figure 6B:
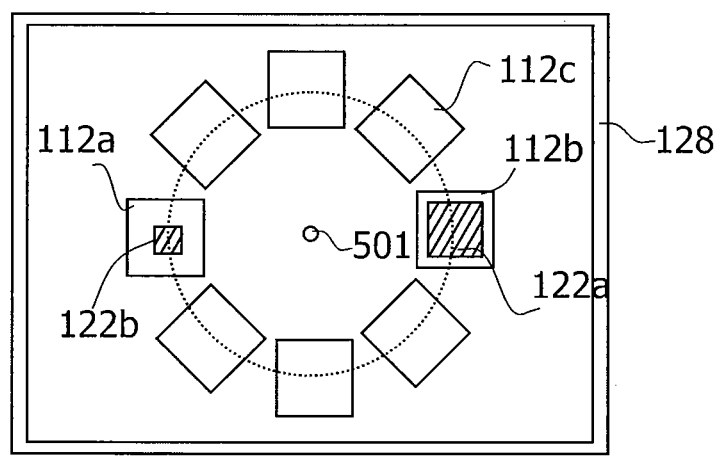

As shown in FIG. 6B, a plurality of substrates 112a, b, c, etc. can be provided on the substrate support portion. Accordingly, the substrate portions for depositing the individual layers thereon can be provided on different substrates. According to yet further embodiments, an aperture arrangement can include a single opening as described with respect to, for example, FIGS. 1A to 2B.

As shown in FIGS. 6A and 6B also a plurality of openings 122a and 122b can be provided. For example, the two or more openings can be provided at different positions of the carrier frame 128 in order to have layers deposited in different regions of the carrier. Thereby, for example, an average layer thickness measurement can be conducted for tooling.

According to yet further embodiments, which can be combined with other embodiments described herein, it is further possible that an aperture arrangement with a plurality of aperture openings is provided, wherein the aperture openings can be individually opened and closed with shutter units. Accordingly, it is also possible to control the exposed substrate portions with an adjusting system connected to the plurality of shutter systems such that, for example, one or two substrate portions are exposed for deposition with one deposition source, respectively. Thereafter, another one or two openings can be opened with respective shutters for depositing a second layer next to the first layer, e.g., being substantially coplanar to the first layer.

As described herein, depositing of individual layers by individual sources can be provided next to each other, i.e. not on top of each other, in order to enable direct layer thickness measurements of layers originating from the different deposition sources without the necessity for loading and unloading of a plurality of substrates or carriers, respectively. The embodiments described herein can be utilized for all kinds of deposition processes which require the tooling or calibration between a measuring unit, a deposition source and/or a real or actual deposition rate. The embodiments are particularly time-saving for applications having a plurality of deposition sources, for example, deposition processes of organic materials. According to yet further embodiments, which can be combined with other embodiments described herein, the processes can be utilized for an initial calibration for tooling. However, it is further possible to utilize the processes and the measuring carrier unit for process control, e.g. during maintenance and the like.

In light of the above, a plurality of embodiments is described. According to one embodiment, a process of coating at least one substrate with a plurality of deposition sources is provided. The process includes exposing a first substrate portion of said at least one substrate to a first deposition source through an aperture of a carrier unit, depositing a first layer over the first substrate portion, said first layer including material from said first deposition source, varying a relative position between said at least one substrate and said aperture for exposing a second substrate portion of said at least one substrate, or another substrate, to a second deposition source, and depositing a second layer over the second substrate portion, said second layer including material from said second deposition source. According to a typical modification thereof, said first substrate portion and said second substrate portion form part of said at least one substrate, e.g. one substrate or two or more substrates. According to yet further embodiments, which can be combined with other embodiments described herein, varying the aperture-substrate relative position can include changing the relative position between said aperture and a vacuum chamber enclosing said carrier unit, varying the aperture-substrate relative position can include moving the at least one substrate; and/or said first layer and said second layer can be deposited such that they are substantially coplanar to each other.

According to another embodiment, a method of tooling a film-thickness monitoring signal is provided. The method includes the process of coating at least one substrate with a plurality of deposition sources. The process includes exposing a first substrate portion of said at least one substrate to a first deposition source through an aperture of a carrier unit, depositing a first layer over the first substrate portion, said first layer including material from said first deposition source, varying a relative position between said at least one substrate and said aperture for exposing a second substrate portion of said at least one substrate, or another substrate, to a second deposition source, and depositing a second layer over the second substrate portion, said second layer including material from said second deposition source. Therein, said film-thickness monitoring signal corresponds to a thickness of a layer deposited over said substrate and is generated while said at least one substrate is exposed, at least partially, to at least one of the plurality of deposition sources. For example, the method can include: generating a first film-thickness monitoring signal associated to said first layer while said first substrate portion is exposed to said first deposition source, generating a second film-thickness monitoring signal associated to said second layer while said second substrate portion is exposed to said second deposition source, performing a direct thickness measurement of said first layer and said second layer, and tooling said first film-thickness monitoring signal and said second film-thickness monitoring signal based on said direct thickness measurement.

According to a yet further embodiment, a carrier unit for carrying at least one substrate within a deposition system including a plurality of deposition sources is provided. The carrier unit includes an aperture for partially exposing said at least one substrate to a deposition source of said deposition system, and an adjusting system configured to adjust a relative position between said at least one substrate and said aperture, so that different portions of said substrate can be exposed to different deposition sources of said deposition system. According to typical embodiments, one or more of the following additional or alternative modifications can be implemented: said adjusting system can be configured to adjust the aperture-substrate relative position by linearly translating and/or rotating at least one of: a) the aperture; or b) the at least one substrate, relative to each other; the carrier unit can further include a carrier frame, wherein said adjusting system is configured to adjust the aperture-substrate relative position by changing the relative position between said aperture and the carrier frame; an said adjusting system can be configured to adjust the aperture-substrate relative position by moving the at least one substrate.

According to an even further embodiment, a deposition system is provided. The deposition system includes at least one vacuum chamber, a plurality of deposition sources for coating a substrate in said at least one vacuum chamber, wherein said deposition system is configured to operate a carrier unit. The carrier unit includes an aperture for partially exposing said at least one substrate to a deposition source of said deposition system, and an adjusting system configured to adjust a relative position between said at least one substrate and said aperture, so that different portions of said substrate can be exposed to different deposition sources of said deposition system. According to typical embodiments, one or more of the following additional or alternative modifications can be implemented: the system can further include one or more deposition rate measurement systems configured to generate a rate signal corresponding to a thickness of a film deposited on said at least one substrate, said rate signal being generated during deposition of said film; the system can further include at least one thickness measuring unit configured to generate a thickness signal corresponding to a direct measurement of the thickness of a film deposited on said at least one substrate; the system can further include a control circuit configured for tooling said rate signal based on said thickness signal.

While the foregoing is directed to embodiments of the invention, other and further embodiments of the invention may be devised without departing from the basic scope thereof, and the scope thereof is determined by the claims that follow.

The invention claimed is:

1. A carrier unit for carrying at least one substrate along a transport direction within a deposition system including a plurality of deposition sources, said carrier unit comprising:
   a carrier frame having an aperture for partially exposing said at least one substrate to a deposition source of said deposition system; and
   an adjusting system configured to move said at least one substrate while said aperture is stationary, so that different portions of said substrate can be exposed by said aperture to different deposition sources of said deposition system.

2. A carrier unit according to claim 1, wherein said adjusting system is configured to adjust the relative position between said at least one substrate and said aperture by linearly translating and rotating the at least one substrate, relative to said aperture.

3. A carrier unit according to claim 1, wherein said adjusting system is configured to adjust the relative position between said at least one substrate and said aperture by linearly translating or rotating the at least one substrate, relative to said aperture.

4. A carrier unit according to claim 1, wherein said at least one substrate is disposed in the carrier frame.

5. A deposition system, comprising:
   at least one vacuum chamber; and
   a plurality of deposition sources for coating at least one substrate in said at least one vacuum chamber, wherein said deposition system is configured to operate a carrier unit that moves said substrate along a transport direction within said vacuum chamber, wherein the carrier unit includes:
   a carrier frame having an aperture for partially exposing said at least one substrate to a deposition source of said deposition system; and
   an adjusting system configured to move said at least one substrate while said aperture is stationary, so that different portions of said substrate can be exposed to different deposition sources of said deposition system.

6. A deposition system according to claim 5, further comprising a deposition rate measurement system configured to generate a deposition rate signal corresponding to a thickness of a film deposited on said at least one substrate, said rate signal being generated during deposition of said film.

7. A deposition system according to claim 5, further comprising at least one thickness measuring unit configured to generate a thickness signal corresponding to a direct measurement of the thickness of a film deposited on said at least one substrate.

8. A deposition system according to claim 5, further comprising a control circuit configured for calibrating said deposition rate signal based on said thickness signal.

* * * * *